United States Patent
Moriyama et al.

(10) Patent No.: US 11,145,792 B2
(45) Date of Patent: Oct. 12, 2021

(54) WAVELENGTH CONVERSION LAYER

(71) Applicant: SHOEI CHEMICAL INC., Tokyo (JP)

(72) Inventors: Takafumi Moriyama, Tosu (JP); Hirokazu Sasaki, Tosu (JP); Makoto Kido, Tosu (JP); Keisuke Matsuura, Tosu (JP); Yuko Mitsuka, Tosu (JP); Naoki Sakura, Tosu (JP)

(73) Assignee: SHOEI CHEMICAL INC., Tokyo (JP)

( * ) Notice: Subject to any disclaimer, the term of this patent is extended or adjusted under 35 U.S.C. 154(b) by 90 days.

(21) Appl. No.: 16/562,341

(22) Filed: Sep. 5, 2019

(65) Prior Publication Data

US 2020/0083406 A1    Mar. 12, 2020

(30) Foreign Application Priority Data

Sep. 6, 2018    (JP) .............................. JP2018-167239

(51) Int. Cl.
*H01L 33/06*    (2010.01)
*H01L 33/50*    (2010.01)
*G02F 1/1335*    (2006.01)

(52) U.S. Cl.
CPC ...... *H01L 33/501* (2013.01); *G02F 1/133514* (2013.01); *H01L 33/06* (2013.01)

(58) Field of Classification Search
None
See application file for complete search history.

(56) References Cited

U.S. PATENT DOCUMENTS

| | | | |
|---|---|---|---|
| 9,169,435 B2 | 10/2015 | Guo et al. | |
| 9,631,141 B2 | 4/2017 | Guo et al. | |
| 9,685,583 B2 | 6/2017 | Guo et al. | |
| 9,884,993 B2 | 2/2018 | Guo et al. | |
| 2015/0083969 A1 | 3/2015 | Kim et al. | |
| 2017/0084796 A1* | 3/2017 | Sung | G02F 1/133603 |
| 2018/0155623 A1 | 6/2018 | Guo et al. | |
| 2018/0231843 A1* | 8/2018 | Park | G02F 1/133512 |
| 2019/0229153 A1* | 7/2019 | Park | C09K 11/0883 |
| 2019/0292446 A1* | 9/2019 | Oba | C09K 11/0883 |

* cited by examiner

*Primary Examiner* — Dung A. Le
(74) *Attorney, Agent, or Firm* — Alleman Hall Creasman & Tuttle LLP

(57) ABSTRACT

The purpose of the present invention to provide a wavelength conversion layer containing semiconductor nanoparticles substantially containing no Cd, and which have an increased absorption coefficient to blue light while maintaining high stability. A wavelength conversion layer containing semiconductor nanoparticles, wherein the wavelength conversion layer can convert light having a wavelength of 450 nm to light having a peak wavelength of 500 nm to 550 nm, or light having a peak wavelength of 600 nm to 660 nm; each of the semiconductor nanoparticles contained in the wavelength conversion layer has a core and a shell having one or more layers; the core contains In and P; and at least one layer of the shell is ZnXTe (wherein X represents Se or S, or both Se and S).

20 Claims, 1 Drawing Sheet

WAVELENGTH CONVERSION LAYER

TECHNICAL FIELD

The present invention relates to wavelength conversion layer.

BACKGROUND ART

Semiconductor nanoparticles (quantum dots: QD) with very small particle size are used as wavelength conversion materials in displays. Semiconductor nanoparticles so small as to induce a quantum confinement effect have band gaps that depend on particle size. Excitons formed within the semiconductor nanoparticles by some means, such as photoexcitation or charge injection, recombine to release photons of energy corresponding to the band gap; accordingly, emission of light of a desired wavelength can be obtained by properly selecting the composition and particle size of the semiconductor nanoparticles. The full width at half maximum of the fluorescence obtained from the semiconductor nanoparticles is narrow, and hence high color reproducibility of display can be achieved by this feature.

For emission of visible lights there can be used Cd chalcogenide semiconductor nanoparticles or InP-based semiconductor nanoparticles (see for instance PTL 1 to 3). Herein InP-based semiconductor nanoparticles are useful by virtue of not containing harmful Cd, but are ordinarily inferior to Cd-based semiconductor nanoparticles as regards fluorescence quantum yield (QY) and full width at half maximum (FWHM).

FIG. 2 illustrates schematically a device configuration for conversion of wavelength from a light source in a conventional display. As illustrated in FIG. 2, a blue LED 101 is used as a light source, and firstly the blue light is converted to white light. To convert the blue light to white light there is suitably used a QD film 102, formed as a film having a thickness of about 100 μm, through dispersion of semiconductor nanoparticles in a resin. The white light obtained from a wavelength conversion layer such as the QD film 102 is further converted to red light, green light and blue light by a color filter (R) 104, a color filter (G) 105 and a color filter (B) 106, respectively. A polarizing plate has been omitted in the depiction of FIG. 2.

CITATION LIST

Patent Literature

[PTL 1] U.S. Patent Application Publication No. 2015/083969 (Specification)
[PTL 2] U.S. Pat. No. 9,169,435 (Specification)
[PTL 3] U.S. Pat. No. 9,884,993 (Specification)

SUMMARY OF INVENTION

Technical Problem

Displays of a type where QD patternings, and not QD films, are used as wavelength conversion layers, have been developed in recent years, as illustrated in FIG. 1 (polarizing plate not shown). In a display of the type illustrated in FIG. 1, blue light from a blue LED 1 is not converted to white light, but is directly converted to red light or green light by QD patternings (7, 8). These QD patternings (7, 8) are formed through patterning of semiconductor nanoparticles dispersed in a resin, to a thickness in the range of about 5 μm to 10 μm, due to the structural limitations of the display. For the color blue there is utilized blue light, generated by the blue LED 1 as the light source and having then passed through a diffusion layer 9 that contains a diffusion agent.

When the thickness of the QD patternings (7, 8) is about 5 μm to 10 μm it is not possible to arrange a large number of semiconductor nanoparticles in an optical path. Accordingly, it is necessary to utilize semiconductor nanoparticles having a greater absorption coefficient. The absorption coefficient is an important index in semiconductor nanoparticles in that the higher the absorption coefficient is the less the amount of semiconductor nanoparticles is required.

The semiconductor nanoparticles in the QD patternings (7, 8) give rise to mixed color when blue light passes through the QD patternings (7, 8) without being sufficiently absorbed. Therefore, the absorption coefficient of the semiconductor nanoparticles that are used in the QD patternings (7, 8) is desirably higher.

A core-shell structure is used in the semiconductor nanoparticles, with a view to increasing fluorescence quantum yield and stability. In conventional semiconductor nanoparticles, however, shell materials thereof have large band gaps thereby having small absorption of blue light, with the result that the absorption coefficient of the semiconductor nanoparticles decreases with increasing shell thickness. The absorption coefficient of the semiconductor nanoparticles can be improved herein by using shell materials having an appropriate band gap, but known shell materials capable of absorbing blue light contain Cd, for instance as in CdZnSeS, and suffer from the problem of toxicity.

It is therefore an object of the present invention to provide a wavelength conversion layer containing semiconductor nanoparticles substantially containing no Cd, and which have an increased absorption coefficient to blue light while maintaining high stability.

The inventors found the following solution to the above problem.

Specifically, the wavelength conversion layer of the present invention is a wavelength conversion layer containing semiconductor nanoparticles, wherein the wavelength conversion layer can convert light having a wavelength of 450 nm to light having a peak wavelength of 500 nm to 550 nm, or light having a peak wavelength of 600 nm to 660 nm;

the semiconductor nanoparticles contained in the wavelength conversion layer have a core and a shell having one or more layers;

the core contains In and P; and at least one layer of the shell is ZnXTe (wherein X represents Se or S, or both Se and S).

In the present application, ranges defined using the wording "to" denote ranges that include the numerals that indicate both ends of the range.

Advantageous Effects of Invention

The present invention allows providing a wavelength conversion layer containing semiconductor nanoparticles substantially containing no Cd, and which have an increased absorption coefficient to blue light while maintaining high stability.

DESCRIPTION OF EMBODIMENTS

Figure 1:
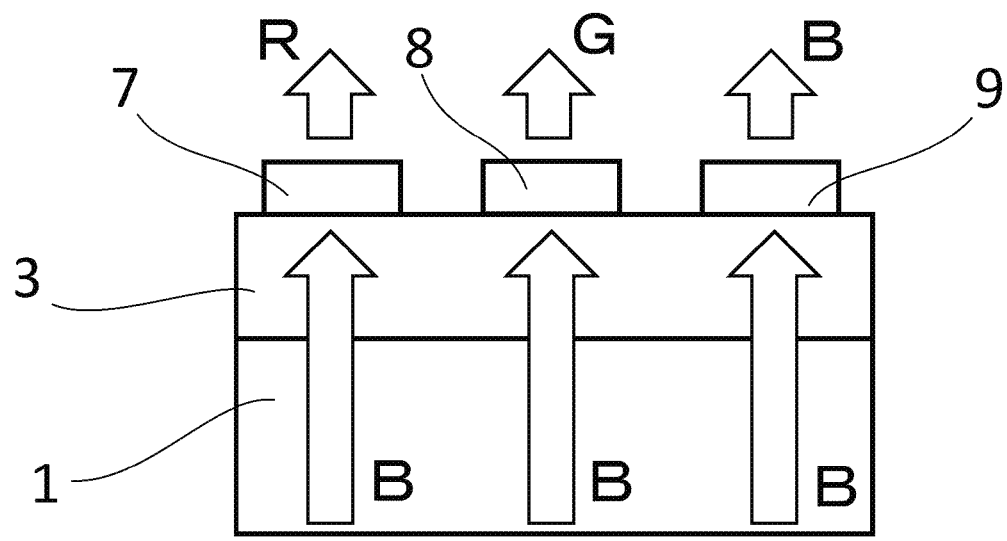
FIG. 1 is a diagram illustrating schematically an example of a display in which a wavelength conversion layer according to an embodiment of the present invention are used as QD patternings.
Figure 2:
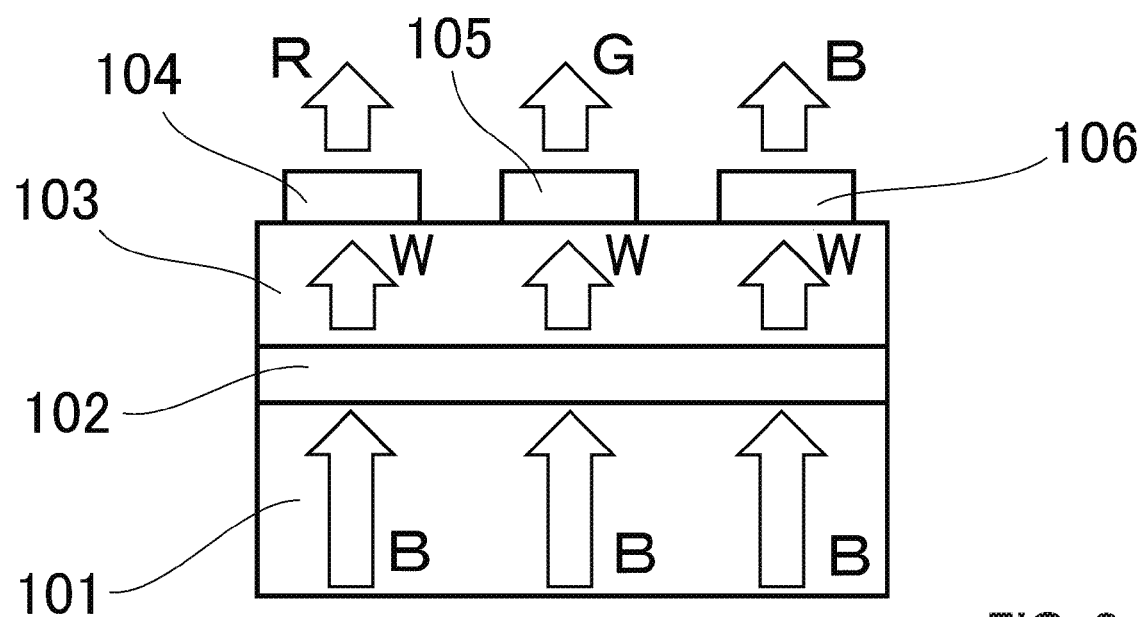
FIG. 2 is a diagram illustrating schematically an example of a display in which semiconductor nanoparticles are used as QD films.

As is known, ZnSe and ZnS, which are frequently used as shell materials for InP-based semiconductor nanoparticles, have excessively large band gaps and thus cannot sufficiently absorb blue light. The inventors studied therefore shell materials capable of absorbing blue light sufficiently, and focused on ZnTe in the process.

The inventors found that although ZnTe can absorb blue light, the band gap of ZnTe exhibits a type-II structure in which the lower end of the conduction band and the upper end of the valence band are positioned at higher energies than those of InP, which therefore renders ZnTe unsuitable as a shell for charge confinement.

As a result of further study, the inventors found that by using ZnSeTe, ZnSTe or ZnSeSTe as a shell material of InP-based semiconductor nanoparticles it becomes possible to regulate the band gap of the shell up to a region in which blue light can be absorbed, while maintaining a type-I structure.

(Semiconductor Nanoparticles)

The semiconductor nanoparticles contained in the wavelength conversion layer according to an embodiment of the present invention are semiconductor nanoparticles having a core-shell structure. In a case where the semiconductor nanoparticles according to an embodiment of the present invention are dispersed in a dispersion medium to yield a 1 mg/mL dispersion liquid, in inorganic mass, the absorbance (OD) thereof for the light having a wavelength of 450 nm, over an optical path length of 1 cm, preferably 0.9 or higher.

A state where the semiconductor nanoparticles are dispersed in a dispersion medium refers to a state in which upon mixing of the semiconductor nanoparticles with a dispersion medium, no semiconductor nanoparticles precipitate, nor do the semiconductor nanoparticles remain in the form of visible turbidity (cloudiness). A liquid resulting from dispersion of the above-described semiconductor nanoparticles in a dispersion medium constitutes herein a dispersion liquid.

By setting the absorbance to 0.9 or higher for the dispersion liquid, semiconductor nanoparticles capable of sufficiently absorbing blue light, even when used for instance as QD patternings having a thickness of about 5 μm to 10 μm, can be obtained. From this viewpoint, the semiconductor nanoparticles, when made into the above dispersion liquid, exhibit more preferably an absorbance at 450 nm of 1.0 or higher over an optical path length of 1 cm. The dispersion medium for dispersing the semiconductor nanoparticles is not particularly limited, and for instance hexane, octadecene, toluene or the like can be used herein.

—Core—

The particle size of the semiconductor nanoparticles is not particularly limited, but for instance is preferably 1 nm to 20 nm, more preferably 1 nm to 10 nm.

The core the semiconductor nanoparticles may contain at least In and P. Other elements contained in the core include for instance Zn, S, Ga or halogens.

Preferably, the average particle size of the core of the semiconductor nanoparticles according to an embodiment of the present invention is about 1 nm to 5 nm. When the average particle size of the core of the semiconductor nanoparticles is about 1 nm to 3 nm, excitation light having a wavelength of 450 nm can be converted to light (green) having a peak wavelength of 500 nm to 550 nm. When the average particle size of the core of the semiconductor nanoparticles is about 3 nm to 5 nm, excitation light having a wavelength of 450 nm can be converted to light (red) having a peak wavelength of 600 nm to 650 nm.

The average particle size of the semiconductor nanoparticles according to an embodiment of the present invention, and the average particle size of the core of the semiconductor nanoparticles, can be measured for instance by calculating the particle size of 10 or more particles in particle images observed using a transmission electron microscope (TEM), on the basis of a surface area-equivalent diameter (Heywood diameter).

Preferably, the shell described below is formed on the core of the semiconductor nanoparticles.

—Shell—

The semiconductor nanoparticles contained in the wavelength conversion layer according to an embodiment of the present invention have one or more shell layers formed from groups II-VI such as Zn and Te, on the surface of the core. In the shell formed on the surface of the core, at least one layer may be made up of ZnSeTe, ZnSTe or ZnSeSTe. Herein ZnXTe (wherein X is Se, S, or Se and S) is a compound made up of elements Zn, X and Te.

In a case where ZnXTe is ZnSeTe, then Te/(Se+Te) is preferably 0.01 to 0.60. A shell material having a very high absorption coefficient for blue light, as compared with shell materials in conventional semiconductor nanoparticles, can be provided by virtue of the fact that Te/(Se+Te) in ZnSeTe is 0.01 or higher. Further, formation of a II-type band structure in the InP/ZnXTe core-shell structure can be prevented, and the exciton confinement effect can be maintained, by virtue of the fact that Te/(Se+Te) in ZnSeTe is 0.60 or less. From these viewpoints, Te/(Se+Te) in ZnSeTe is more preferably 0.03 to 0.50, and yet more preferably 0.05 to 0.50.

In a case where ZnXTe is ZnSTe, then Te/(S+Te) is preferably 0.01 to 0.60. For the same reasons as in the case of ZnSeTe above, Te/(S+Te) in ZnSTe is more preferably 0.02 to 0.60, and yet more preferably 0.05 to 0.60.

In a case where ZnXTe is ZnSeSTe, then Te/(Se+S+Te) is preferably 0.02 to 0.50. From the same viewpoints as in the case of ZnSeTe above, Te/(Se+S+Te) in ZnSeSTe is more preferably 0.05 to 0.50, and yet more preferably 0.10 to 0.50.

Preferably, the thickness of the shell made up of the above ZnXTe is 1.5 nm or greater. As a result it becomes possible to provide a shell material capable of sufficiently absorbing blue light. From the above viewpoint, the thickness of the shell made up of ZnXTe is more preferably 2.0 nm or greater.

The upper limit of the thickness of the shell made up of ZnXTe is not particularly restricted, but the total thickness with the thickness of shell layers from other components is preferably 5 nm or less. As a result it becomes possible to increase the content of semiconductor nanoparticles in a dispersion medium, or in a QD film or QD patterning such as those described below. From the above viewpoint, the total of the thickness of the shell made up of ZnXTe plus the thickness of shell layers made up of other components is more preferably 4 nm or less.

ZnXTe with a low content of Te, as well as ZnS, ZnSe and ZnSeS containing no Te, have a large and stable band gap, and hence the portion of the shell of the semiconductor nanoparticles closer to the outer side is preferably made up of such components.

Accordingly, the shell made up of ZnXTe, within the shell of the semiconductor nanoparticles contained in the wavelength conversion layer according to an embodiment of the present invention, has preferably formed therein a concentration gradient such that the content of Te in ZnXTe decreases towards the outside of the shell. The wording towards the outside of the shell denotes herein a direction bearing away from the central portion of the core.

When the content of Te in a shell made up of ZnXTe exhibits a concentration gradient, the concentration of Te may change not just continuously, but may also change non-continuously in some instances. Examples of instances where the content of Te changes non-continuously towards the outside of the shell include for example an instance where two or more layers are sequentially formed, with a constant Te concentration within each respective layer, such that the Te concentration in shell layers closer to the core is higher, and a shell layer having a lower Te concentration is formed on the shell layer closer to the core.

Preferably, the semiconductor nanoparticles contained in the wavelength conversion layer according to an embodiment of the present invention have two or more shell layers, and the shell at the outermost layer is formed of ZnS. As described above, ZnS has a large band gap, and accordingly the outermost layer of the semiconductor nanoparticles can be stabilized by virtue of the fact the outermost layer is made up of ZnS.

Preferably, the semiconductor nanoparticles contained in the wavelength conversion layer according to an embodiment of the present invention have two or more shell layers, and the shell at the outermost layer is formed of an oxide. Degradation of the semiconductor nanoparticles with time can be suppressed by virtue of the fact that an oxide coating is provided on the outermost surface of the semiconductor nanoparticles. Examples of the oxide that makes up the shell at the outermost layer include for instance $Al_2O_3$, $SiO_2$ and ZnO.

Preferably, the fluorescence quantum yield of the semiconductor nanoparticles contained in the wavelength conversion layer according to an embodiment of the present invention is 70% or higher. The higher the fluorescence quantum yield, the higher is the efficiency with which fluorescence is obtained from incident light. Accordingly, it is more preferred when the fluorescence quantum yield is higher. The fluorescence quantum yield is more preferably 80% or higher.

Preferably, the fluorescence full width at half maximum of the semiconductor nanoparticles contained in the wavelength conversion layer according to an embodiment of the present invention is 42 nm or less. The smaller the fluorescence full width at half maximum, fluorescence having the more uniform wavelengths is obtained. Therefore, it is more preferred when the fluorescence full width at half maximum is narrower. The fluorescence full width at half maximum is more preferably 38 nm or less.

In a case where the semiconductor nanoparticles contained in the wavelength conversion layer according to an embodiment of the present invention are heated in the atmosphere under conditions that involve heating at 180° C. for 5 hours, the rate of change of fluorescence quantum yield from before heating to after heating is preferably 10% or less. The lower the rate of change of fluorescence quantum yield from before to after heating, the higher becomes the stability towards changes in temperature that is exhibited by the semiconductor nanoparticles. Accordingly, the lower the rate of change in fluorescence quantum yield from before to after heating, the more preferred the semiconductor nanoparticles are. The above rate of change is more preferably 5% or less.

Preferably, the content of Cd in the semiconductor nanoparticles contained in the wavelength conversion layer according to an embodiment of the present invention is 100 ppm or less. Blue light absorbance increases when Cd is present, for instance as in a shell made up of CdZnSeS, but the toxicity of Cd is a problem, as pointed out above. Preferably, the semiconductor nanoparticles contain therefore substantially no Cd. Containing substantially no Cd signifies herein that the content of Cd in the semiconductor nanoparticles is 100 ppm or less. The lower the content of Cd in the semiconductor nanoparticles, the more preferable the semiconductor nanoparticles are. The content of Cd is more preferably 50 ppm or less.

The semiconductor nanoparticles contained in the wavelength conversion layer according to an embodiment of the present invention may contain elements other than In, P, Zn, S, Se and Te, inevitably or intentionally, so long as the effect of the present invention is not impaired thereby. For instance, the semiconductor nanoparticles may contain elements such as Si, Ge or halogens.

(Method for Producing Semiconductor Nanoparticles)

The method for producing the semiconductor nanoparticles contained in the wavelength conversion layer according to an embodiment of the present invention is not particularly limited, and for instance the semiconductor nanoparticles may be produced as described below.

—Core Synthesis—

The InP-based semiconductor nanoparticles are synthesized through reaction of an In precursor and a P precursor.

Examples of the In precursor include, although not limited to, indium carboxylates such as indium acetate, indium propionate, indium myristate and indium oleate; indium halides such as indium fluoride, indium chloride, indium bromide and indium iodide; as well as indium thiolates and trialkylindiums.

Examples of the P precursor include, although not limited to, for instance tris(trimethylsilyl)phosphine, tris(trimethylgermyl)phosphine, tris(dimethylamino)phosphine, tris(diethylamino)phosphine, tris(dioctylamino)phosphine, trialkyl phosphines and $PH_3$ gas.

Herein Si may become incorporated into the composition of the semiconductor nanoparticles in a case where the P precursor is tris(trimethylsilyl)phosphine, but the effect of the present invention is not impaired thereby.

The In precursor is mixed with a solvent, to produce a metal precursor solution. A dispersant and/or additive illustrated below may be added as needed to the metal precursor solution. The dispersant, which becomes coordinated on the surface of the semiconductor nanoparticles, has the function of preventing aggregation between particles, and eliciting stable dispersion in the solvent. In a case where the metal precursor has long carbon chains, the dispersant is not necessarily be added, since in that case the long carbon chains function as a dispersant.

Examples of the dispersant include, although not limited to, carboxylic acids, amines, thiols, phosphines, phosphine oxides, phosphinic acids and phosphonic acids. The dispersant can double as a solvent.

Examples of the solvent include, although not limited to, 1-octadecene, hexadecane, squalane, oleylamine, trioctyl phosphine and trioctyl phosphine oxide.

Examples of the additive include S precursors, Zn precursors and halides. Effects elicited through addition of these precursors and halides as additives include further narrowing of the size distribution of the core particles, narrowing of the full width at half maximum, and increasing quantum yield.

Examples of S precursors include, although not limited to, trioctylphosphine sulfide, tributylphosphine sulfide, thiols and bis(trimethylsilyl) sulfide.

Examples of Zn precursors include, although not limited to, zinc carboxylates such as zinc acetate, zinc propionate, zinc myristate and zinc oleate; zinc halides such as zinc fluoride, zinc chloride, zinc bromide and zinc iodide; as well as zinc thiolates and dialkylzincs.

Examples of halides include, although not limited to, HF, HCl, HBr, HI, carboxylic acid halides such as oleoyl chloride and octanoyl chloride; and metal halides such as zinc chloride, indium chloride and gallium chloride.

The additives used herein may be added to the metal precursor solution, or may be caused to react with core particles by being added after synthesis of the core.

In one embodiment, a metal precursor solution resulting from adding the In precursor and, as needed, a dispersant and an additive into a solvent, is mixed under vacuum, and the whole is then heated at 100° C. to 300° C., for 6 hours to 24 hours, followed by addition of the P precursor, with heating at 200° C. to 400° C. for 1 minute to 60 minutes, and subsequent cooling, to thereby yield a core particle dispersion liquid having dispersed therein core particles of the semiconductor nanoparticles.

—Shell Synthesis—

A shell is then formed by further adding Zn, X and Te (wherein X represents Se or S, or both Se and S), to the core particle dispersion liquid that is synthesized as above or a halogen-added core particle dispersion liquid, thus semiconductor nanoparticles of high blue light absorbance can be obtained as a result.

Herein Zn, Se, S and Te are present mainly in the vicinity of the surface of the core particles, and have the role of protecting semiconductor nanoparticles against external factors. These elements are present not only mainly on the surface of the core particles, but part of the elements may also get into the core particles through diffusion.

Examples of the Zn precursor that is added during shell formation include, although not limited to, zinc carboxylates such as zinc acetate, zinc propionate, zinc myristate and zinc oleate; zinc halides such as zinc fluoride, zinc chloride, zinc bromide and zinc iodide; as well as zinc thiolates and dialkylzincs. The Zn precursor that is added during shell formation may be the same Zn precursor as the Zn precursor that is added during production of the core, or may be a different Zn precursor.

Examples of Se precursors include, although not limited to, trialkylphosphine selenides and selenol.

Examples of S precursors include, although not limited to, trioctylphosphine sulfide, tributylphosphine sulfide, thiols and bis(trimethylsilyl) sulfide. The S precursor that is added during shell formation may be identical to the S precursor during production of the core, or may be a different S precursor.

Examples of Te precursors include, although not limited to, trioctylphosphine telluride and tributylphosphine telluride.

In one embodiment, a Zn precursor, a Se precursor and a Te precursor are added to the core particle dispersion liquid described above, followed by heating at 150° C. to 300° C., yet more preferably at 180° C. to 250° C., after which a Zn precursor and a S precursor are added, whereupon the whole is heated at 200° C. to 400° C., preferably at 250° C. to 350° C., to thereby form a shell containing ZnSeTe, on the surface of the core particles. Semiconductor nanoparticles are then obtained through formation of a shell containing ZnS, on the outer side of the shell.

The shell precursors may be mixed beforehand, and may be added all at once or divisionally in aliquots, or each precursor may be added individually, all at once or divisionally in aliquots. In a case where the shell precursor is added divisionally in aliquots, heating may be carried out by modifying the respective temperatures after addition of the respective shell precursors. In a case where the Te precursor is added in multiple aliquots, semiconductor nanoparticles having a shell exhibiting a gradient such that the content of Te in ZnXTe decreases towards the exterior of the shell can be obtained by sequentially lowering the concentration of Te in the Te precursor. Semiconductor nanoparticles having an outermost layer formed by ZnS as described above can be obtained by adding the Zn precursor and S precursor lastly.

—Purification—

The semiconductor nanoparticles thus obtained can be further purified. For instance, the semiconductor nanoparticles can be caused to precipitate from a solution through addition of a polarity reversing solvent such as acetone. The semiconductor nanoparticles can be recovered by filtration and/or centrifugation. A supernatant containing unreacted starting materials and other impurities can be discarded or be reused. The recovered semiconductor nanoparticles can then be washed with additional solvent, and be dissolved. This purification process can be repeated, for instance two to four times, or until the desired purity is reached. Other purification schemes include for instance aggregation, liquid-liquid extraction, distillation, electrodeposition, size exclusion chromatography and/or ultrafiltration. Any or all of these purification schemes can be resorted to, singly or in combinations.

A surfactant can be added to the semiconductor nanoparticles having the shell thus formed thereon, with stirring, followed by addition of an inorganic content composition, and renewed stirring, so that, as a result, an oxide-derived outermost layer can be formed on the surface of the semiconductor nanoparticles.

The surfactant that is used herein is not particularly limited, and examples thereof include sodium dodecyl sulfate, sodium lauryl sulfate, n-butanol and dioctyl sodium sulfosuccinate.

The inorganic content composition is not particularly limited, and may be for instance a silane coupling agent, a titanate coupling agent or an aluminate coupling agent.

In one embodiment, the semiconductor nanoparticles having a shell formed thereon are purified, after which an aqueous solution containing a surfactant is added, with mixing and stirring of the resulting mixed solution, to form micelles as a result. Formation of micelles can be verified on the basis of the cloudiness of the mixed solution. The aqueous phase in which micelles are formed is recovered, and the inorganic content composition is added to the recovered aqueous phase, with mixing for 10 minutes to 6 hours at 10° C. to 30° C. Unreacted substances are then removed, followed by re-purification, to yield semiconductor nanoparticles having an oxide outermost layer.

The method for forming an oxide outermost layer is not limited to the method described above, and other known methods may be resorted to, for instance addition of the inorganic content composition at the time of shell synthesis.

—Process—

In one embodiment, the above process can be performed as a batch process. In other embodiments, at least part of the above process can be carried out in accordance with the continuous flow processes disclosed for instance in WO 2016/194802, WO 2017/014314, WO 2017/014313 and International Application No. PCT/JP2017/016494.

(Applications)

The semiconductor nanoparticles contained in the wavelength conversion layer according to an embodiment of the present invention can be used as a semiconductor nanoparticle dispersion liquid by being dispersed for instance in a suitable organic substance or medium. The viscosity of the dispersion liquid is not particularly limited. The dispersion liquid of semiconductor nanoparticles can be used in an optical member, for instance a QD film or QD patterning.

(Wavelength Conversion Layer)

The wavelength conversion layer according to an embodiment of the present invention is a wavelength conversion layer containing the above-described semiconductor nanoparticles, and capable of converting light having a wavelength of 450 nm (blue light) to light having a peak wavelength of 500 nm to 550 nm (green light) or light having a peak wavelength of 600 nm to 660 nm (red light).

The wavelength conversion layer according to an embodiment of the present invention can be obtained as a result of a baking step of a semiconductor nanoparticle-containing photoresist, or a solvent removal and resin curing step after inkjet patterning of semiconductor nanoparticles.

The above-described semiconductor nanoparticles exhibit very high blue light absorbance, and accordingly can be used particularly suitably in a wavelength conversion layer such as very thin QD patternings, having a thickness of about 10 μm, as in a display having the structure illustrated in FIG. 1. The wavelength conversion layer according to an embodiment of the present invention can sufficiently absorb blue light, and hence allows suppressing mixed color derived from transmission of blue light.

In a case where the wavelength conversion layer according to an embodiment of the present invention has a thickness of 5 μm, the optical density thereof in a direction perpendicular to the layer is preferably 1 or higher with respect to light having a wavelength of 450 nm. This allows preventing blue light from becoming mixed into green and red light, and allows widening the usable color gamut. The optical density is preferably 1.5 or higher with respect to light having a wavelength of 450 nm.

Preferably, the content of the semiconductor nanoparticles in the wavelength conversion layer according to an embodiment of the present invention is 20 mass % to 60 mass %. A wavelength conversion layer of very high blue light absorbance can be provided by virtue of the fact that the content of the semiconductor nanoparticles in the wavelength conversion layer is 20 mass % or higher. Effect impairment derived from a decrease in the content of resin component can moreover be prevented by virtue of the fact that the proportion of the semiconductor nanoparticles in the wavelength conversion layer is 60 mass % or lower. From the above viewpoints, the content of the semiconductor nanoparticles in the wavelength conversion layer is more preferably 25 mass % to 50 mass %.

(Measurement)

Elemental analysis of the semiconductor nanoparticles can be accomplished for instance using a high-frequency inductively-coupled plasma emission analyzer (ICP) or an X-ray fluorescence analyzer (XRF). In an ICP measurement, purified semiconductor nanoparticles are dissolved in nitric acid, with heating, followed by dilution with water and measurement in accordance with a calibration curve method using an ICP emission analyzer (ICPS-8100, by Shimadzu Corporation). In an XRF measurement, filter paper impregnated with a dispersion liquid is set in a sample holder, and quantitative analysis is performed using an X-ray fluorescence analyzer (ZSX100e, by Rigaku Corporation).

The optical characteristics of the semiconductor nanoparticles can be measured using a fluorescence quantum yield measurement system (QE-2100, by Otsuka Electronics Co., Ltd.). The obtained semiconductor nanoparticles are dispersed in a dispersion medium, and excitation light is projected onto the dispersion liquid, to obtain an emission spectrum. Then fluorescence quantum yield (QY) and full width at half maximum (FWHM) are calculated on the basis of a re-excitation-corrected emission spectrum that is obtained by excluding, from the obtained emission spectrum, the fraction of a re-excitation fluorescence emission spectrum derived from fluorescence emission upon re-excitation. Examples of the dispersion medium include for instance n-hexane and octadecene dispersions.

The heat resistance of the semiconductor nanoparticles is evaluated on a dry powder of the semiconductor nanoparticles. The solvent is removed from the purified semiconductor nanoparticles, and the semiconductor nanoparticles are heated in the atmosphere at 180° C., for 5 hours, in a dry powder state. After the thermal treatment, the semiconductor nanoparticles are re-dispersed in a dispersion liquid, and fluorescence quantum yield corrected for re-excitation (=QYb) is measured. The rate of change of fluorescence quantum yield from before to after heating the thermal treatment (thermal resistance) can be calculated in accordance with the expression below, where (QYa) denotes fluorescence quantum yield before heating.

$$\{1-(QYb/QYa)\}\times 100 \qquad \text{(Expression):}$$

Embodiments of the present invention include (1) through (14) described below.

(1) A wavelength conversion layer containing semiconductor nanoparticles, wherein each of the semiconductor nanoparticles contained in the wavelength conversion layer has a core and a shell having one or more layers;

the wavelength conversion layer can convert light having a wavelength of 450 nm to light having a peak wavelength of 500 nm to 550 nm, or light having a peak wavelength of 600 nm to 660 nm;

the core contains In and P; and at least one layer of the shell is ZnXTe (wherein X represents Se or S, or both Se and S).

(2) The wavelength conversion layer according to (1), wherein when the wavelength conversion layer has a thickness of 5 μm, the wavelength conversion layer has an optical density in a direction perpendicular to the layer of 1 or higher with respect to light having a wavelength of 450 nm.

(3) The wavelength conversion layer according to (1) or (2), wherein a content of the semiconductor nanoparticles in the wavelength conversion layer is 20 mass % to 60 mass %.

(4) The wavelength conversion layer according to any one of (1) to (3), wherein amounts of X and Te contained in the shell satisfy Te/(X+Te)=0.01 to 0.60 (wherein X is Se).

(5) The wavelength conversion layer according to any one of (1) to (3), wherein amounts of X and Te contained in the shell satisfy Te/(X+Te)=0.01 to 0.60 (wherein X is S).

(6) The wavelength conversion layer according to any one of (1) to (3), wherein amounts of X and Te contained in the shell satisfy Te/(X+Te)=0.02 to 0.50 (wherein X includes both Se and S).

(7) The wavelength conversion layer according to any one of (1) to (6), wherein a shell made up of the ZnXTe of the semiconductor nanoparticles has a gradient such that the content of Te in the ZnXTe decreases towards the outside of the shell.

(8) The wavelength conversion layer according to any one of (1) to (7), wherein
the shell of the semiconductor nanoparticles has two or more layers, and the outermost layer is ZnS.

(9) The wavelength conversion layer according to any one of (1) to (7), wherein
the shell of the semiconductor nanoparticles has two or more layers, and the outermost layer is an oxide.

(10) The wavelength conversion layer according to any one of (1) to (9), wherein
a fluorescence quantum yield of the semiconductor nanoparticles is 70% or higher.

(11) The wavelength conversion layer according to any one of (1) to (10), wherein
a fluorescence full width at half maximum of the semiconductor nanoparticles is 42 nm or less.

(12) The wavelength conversion layer according to any one of (1) to (11), wherein
the semiconductor nanoparticles include semiconductor nanoparticles which cause, when dispersed in a dispersion medium to yield a dispersion liquid with a concentration of 1 mg/mL in inorganic mass, the dispersion liquid to have an absorbance of 0.9 or higher with respect to light having a wavelength of 450 nm at an optical path length of 1 cm.

(13) The wavelength conversion layer according to any one of (1) to (12), wherein
the semiconductor nanoparticles include semiconductor nanoparticles which have a rate of change in fluorescence quantum yield from before heating to after heating of 10% or less when heated in the atmosphere at 180° C. for 5 hours.

(14) The wavelength conversion layer according to any one of (1) to (13), wherein
a content of Cd in the semiconductor nanoparticles is 100 ppm or less.

The features and/or methods described in the present specification are illustrated by way of example, and can accommodate multiple variations, and accordingly such concrete examples and examples should not be construed as limiting in any way. The specific procedures and methods described in the present specification may represent one of multiple processing methods. Therefore, each of the actions explained and/or described herein can be performed in the order in which they are explained and/or described, or can be omitted. The order in the methods described above can likewise be changed.

The subject matter of this disclosure includes all novel and non-obvious combinations and sub-combinations of the various method, systems and configurations, and other features, functions, acts, and/or properties disclosed in the present specification, as well as any and all equivalents thereof.

EXAMPLES

Herein InP-based semiconductor nanoparticles were produced, in accordance with the method below, and the compositions, optical characteristics and temperature characteristics of the obtained InP-based semiconductor nanoparticles were measured.
<Core>
Indium acetate (0.3 mmol) and zinc oleate (0.6 mmol) were added to a mixture of oleic acid (0.9 mmol), 1-dodecanethiol (0.1 mmol) and octadecene (10 mL), and the reaction was allowed to proceed for 1 hour, with heating at about 120° C. under vacuum (<20 Pa). The mixture having reacted in vacuum was placed in a nitrogen atmosphere at 25° C., and then tris(trimethylsilyl)phosphine (0.2 mmol) was added to the mixture, after which the reaction was allowed to proceed for 10 minutes with heating at about 300° C. The reaction solution was cooled to 25° C. and octanoate chloride (0.45 mmol) was injected, with heating for 30 minutes at about 250° C., followed by cooling to 25° C., to yield a dispersion liquid of InP-based semiconductor nanoparticles. The average particle size of the obtained InP-based semiconductor nanoparticles was 2.6 nm.

Semiconductor nanoparticles having a core-shell structure were then produced as described below by using the obtained InP-based semiconductor nanoparticles as a core, and by forming, on the surface of the core, respective shells having the configuration given in Table 1.

In Test example 9 set out in Table 1 below, 0.06 mmol of indium acetate, 1.2 mmol of oleic acid, and 0.4 mmol of tris(trimethylsilyl)phosphine were allowed to react for 30 minutes, to thereby bring the average particle size of the semiconductor nanoparticles to 3.7 nm.
<Shell>
To produce a shell, precursors were prepared first.
—Preparation of Zn Precursor Solution—
Herein 40 mmol of zinc oleate and 75 mL of octadecene were mixed, and the resulting mixture was evacuated and heated for 1 hour at 110° C., to prepare a [Zn]=0.4 M Zn precursor solution.
—Preparation of Se Precursor (trioctylphosphine selenide)—
Herein 22 mmol of a selenium powder and 10 mL of trioctylphosphine were mixed in nitrogen, with stirring until complete dissolution, to thereby obtain [Se]=2.2 M trioctylphosphine selenide.
—Preparation of S Precursor (trioctylphosphine sulfide)—
Herein 22 mmol of a sulfur powder and 10 mL of trioctylphosphine were mixed in nitrogen, with stirring until complete dissolution, to thereby obtain [S]=2.2 M trioctylphosphine sulfide.
—Preparation of Te Precursor (trioctylphosphine telluride)—
Herein 3 mmol of a tellurium powder and 10 mL of trioctylphosphine were mixed in nitrogen, heated to 250° C. with stirring until complete dissolution, to thereby obtain [Te]=0.3 M trioctylphosphine tellurium.
—Shell Formation—
Using the precursors thus obtained, a shell was formed on the surface of the core in the manner described below.

A dispersion liquid of the cores was heated up to 200° C. Then 0.75 mL of a Zn precursor solution, trioctylphosphine selenide and/or trioctylphosphine sulfide, and trioctylphosphine telluride, were added simultaneously, at 200° C., and the reaction was allowed to proceed for 30 minutes to form a ZnSeTe shell, a ZnSTe shell or a ZnSeSTe shell on the surface of the cores (InP-based semiconductor nanoparticles).

The shells of the respective semiconductor nanoparticles exhibited values of Te/(Se+Te), Te/(S+Te) or Te/(Se+S+Te) as given in Table 1. In Table 1 the reference symbol X denotes Se, S, or Se and S, in such ZnSeTe, ZnSTe or ZnSeSTe. An instance where Te/(Se+Te), Te/(S+Te) or Te/(Se+S+Te) is 0 signifies that Te=0, i.e. that no trioctylphosphine telluride was added during formation of ZnXTe shell.

Further, 1.5 mL of the Zn precursor solution and 0.6 mmol of trioctylphosphine sulfide were added, and the temperature was raised to 250° C., with a reaction for 1 hour, to form a ZnS shell.

<Purification>

Acetone was added to a solution resulting from dispersion of the semiconductor nanoparticles of core-shell type structure thus obtained, to elicit aggregation of the semiconductor nanoparticles, which were then centrifuged (4000 rpm; 10 minutes), followed by supernatant removal and re-dispersion of the resulting semiconductor nanoparticles in hexane. This was repeated to obtain a purified semiconductor nanoparticles hexane solution.

The average particle size of the obtained semiconductor nanoparticles was 5.8 nm.

The average particle size of the semiconductor nanoparticles in Test example 9 set out in Table 1 was 6.8 nm.

—Rate of Change of Fluorescence Quantum Yield from Before to After Heating Treatment—

Thermal resistance was evaluated in accordance with the method described above.

—Composition—

Composition analysis involved measurements using an X-ray fluorescence analyzer (XRF).

<Wavelength Conversion Layer>

An ultraviolet-curable resin was obtained by mixing 89 parts by mass of isobornyl acrylate, 10 parts by mass of tritrimethylolpropane triacrylate and 1 part by mass of 2,2-dimethoxy-2-phenylacetophenone. The resin was mixed with a predetermined inorganic mass of semiconductor nanoparticles, and a film of the mixture was formed on glass by spin coating. The film was cured by being irradiated with ultraviolet rays in nitrogen. The optical density per 5 μm of the wavelength conversion layer was calculated using a visible-ultraviolet spectrophotometer.

TABLE 1

| | color | QD content | X | Optical density per 5 μm thickness | Te/(X+Te) | Se:S in ZnXTe layer | Outermost layer | Fluorescence quantum yield (%) | Absorbance (1 mg/mL) | Rate of change of fluorescence quantum yield from before to after a heating treatment (%) |
|---|---|---|---|---|---|---|---|---|---|---|
| Test example 1 | Green | 30 | Se | 1.0 | 0.01 | 100:0 | ZnS | 83 | 0.6 | 5 |
| Test example 2 | Green | 30 | Se | 1.1 | 0.025 | 100:0 | ZnS | 82 | 0.7 | 10 |
| Test example 3 | Green | 30 | Se | 1.3 | 0.03 | 100:0 | ZnS | 79 | 0.9 | 10 |
| Test example 4 | Green | 30 | Se | 1.4 | 0.05 | 100:0 | ZnS | 79 | 1.0 | 10 |
| Test example 5 | Green | 20 | Se | 1.2 | 0.20 | 100:0 | ZnS | 77 | 1.1 | 10 |
| Test example 6 | Green | 30 | Se | 1.6 | 0.20 | 100:0 | ZnS | 77 | 1.1 | 10 |
| Test example 7 | Green | 20 | Se | 1.2 | 0.50 | 100:0 | ZnS | 75 | 1.2 | 10 |
| Test example 8 | Green | 30 | Se | 1.7 | 0.50 | 100:0 | ZnS | 75 | 1.2 | 10 |
| Test example 9 | Red | 30 | Se | 1.8 | 0.20 | 100:0 | ZnS | 78 | 1.3 | 10 |
| Test example 10 | Green | 30 | S | 1.0 | 0.02 | 0:100 | ZnS | 82 | 0.9 | 10 |
| Test example 11 | Green | 30 | S | 1.4 | 0.05 | 0:100 | ZnS | 80 | 1.2 | 10 |
| Test example 12 | Green | 30 | S | 1.6 | 0.10 | 0:100 | ZnS | 80 | 1.3 | 10 |
| Test example 13 | Green | 30 | S | 1.7 | 0.20 | 0:100 | ZnS | 77 | 1.4 | 10 |
| Test example 14 | Green | 30 | S | 1.8 | 0.30 | 0:100 | ZnS | 76 | 1.5 | 10 |
| Test example 15 | Green | 30 | S | 1.9 | 0.60 | 0:100 | ZnS | 65 | 1.5 | 10 |
| Test example 16 | Green | 30 | Se, S | 1.2 | 0.05 | 30:70 | ZnS | 81 | 1.0 | 5 |
| Test example 17 | Green | 30 | Se, S | 1.3 | 0.20 | 30:70 | ZnS | 75 | 1.1 | 10 |
| Test example 18 | Green | 30 | Se, S | 1.3 | 0.50 | 30:70 | ZnS | 71 | 1.2 | 10 |
| Test example 19 | Green | 30 | Se | 0.7 | 0 | 100:0 | ZnS | 85 | 0.6 | 5 |
| Test example 20 | Green | 30 | Se | 1.8 | 0.75 | 100:0 | ZnS | 55 | 1.3 | 20 |
| Test Example 21 | Green | 30 | S | 0.9 | 0 | 0:100 | ZnS | 86 | 0.7 | 10 |
| Test Example 22 | Green | 30 | S | 1.9 | 0.80 | 0:100 | ZnS | 58 | 1.6 | 30 |
| Test Example 23 | Green | 30 | Se, S | 0.7 | 0 | 30:70 | ZnS | 84 | 0.6 | 5 |
| Test Example 24 | Green | 30 | Se, S | 1.3 | 0.55 | 30:70 | ZnS | 68 | 1.2 | 10 |
| Test Example 25 | Green | 30 | Se, S | 1.5 | 0.80 | 30:70 | ZnS | 40 | 1.3 | 20 |

In the table, X denotes Se or S, or Se and S, in ZnSeTe, ZnSTe and ZnSeSTe.

<Evaluation>

The absorbance, fluorescence quantum yield, rate of change of fluorescence quantum yield from before to after a heating treatment, and the composition of the purified semiconductor nanoparticles, were evaluated as follows. Evaluation results are given in Table 1.

—Absorbance—

The inorganic fraction concentration in the hexane solution of semiconductor nanoparticles was carried out by thermogravimetric analysis. The temperature was raised to 550° C. at a rate of 1° C./min, and was held for 10 minutes. The residue remaining thereafter was taken as the inorganic mass of the nanoparticles in the hexane solution. Concentration was adjusted to 1 g/mL on the basis of this value. The solution was placed in an optical cell having an optical path length of 1 cm, and the absorbance at 450 nm was determined as $OD_{450}$ using a visible ultraviolet spectrophotometer.

—Fluorescence Quantum Yield—

Optical characteristics were measured using a quantum yield measurement system, as described above. Herein a 450 nm single wavelength was used as the excitation light.

REFERENCE CHARACTERS LIST

1 Blue LED
3 Liquid crystal
7 QD patterning (R)
8 QD patterning (G)
9 Diffusion layer
101 Blue LED
102 QD film
103 Liquid crystal
104 Color filter (R)
105 Color filter (G)
106 Color filter (B)

The invention claimed is:

1. A wavelength conversion layer containing semiconductor nanoparticles, wherein
    each of the semiconductor nanoparticles contained in the wavelength conversion layer has a core and a shell having one or more layers;

the wavelength conversion layer can convert light having a wavelength of 450 nm to light having a peak wavelength of 500 nm to 550 nm, or light having a peak wavelength of 600 nm to 660 nm;

the core contains In and P;

at least one layer of the shell is ZnXTe (wherein X represents Se or S, or both Se and S); and when the wavelength conversion layer has a thickness of 5 μm, the wavelength conversion layer has an optical density in a direction perpendicular to the layer of 1 or higher with respect to light having a wavelength of 450 nm.

2. The wavelength conversion layer according to claim 1, wherein
a content of the semiconductor nanoparticles in the wavelength conversion layer is 20 mass % to 60 mass %.

3. The wavelength conversion layer according to claim 1, wherein
amounts of X and Te contained in the shell satisfy Te/(X+Te)=0.01 to 0.60 (wherein X is Se).

4. The wavelength conversion layer according to claim 1, wherein
amounts of X and Te contained in the shell satisfy Te/(X+Te)=0.01 to 0.60 (wherein X is S).

5. The wavelength conversion layer according to claim 1, wherein
amounts of X and Te contained in the shell satisfy Te/(X+Te)=0.02 to 0.50 (wherein X includes both Se and S).

6. The wavelength conversion layer according to claim 1, wherein
a shell made up of the ZnXTe of the semiconductor nanoparticles has a gradient such that the content of Te in the ZnXTe decreases towards the outside of the shell.

7. The wavelength conversion layer according to claim 1, wherein
the shell of the semiconductor nanoparticles has two or more layers, and the outermost layer is ZnS.

8. The wavelength conversion layer according to claim 1, wherein
the shell of the semiconductor nanoparticles has two or more layers, and the outermost layer is an oxide.

9. The wavelength conversion layer according to claim 1, wherein
a fluorescence quantum yield of the semiconductor nanoparticles is 70% or higher.

10. The wavelength conversion layer according to claim 1, wherein
a fluorescence full width at half maximum of the semiconductor nanoparticles is 42 nm or less.

11. The wavelength conversion layer according to claim 1, wherein
the semiconductor nanoparticles include semiconductor nanoparticles which cause, when dispersed in a dispersion medium to yield a dispersion liquid with a concentration of 1 mg/mL in inorganic mass, the dispersion liquid to have an absorbance of 0.9 or higher with respect to light having a wavelength of 450 nm at an optical path length of 1 cm.

12. The wavelength conversion layer according to claim 1, wherein
the semiconductor nanoparticles include semiconductor nanoparticles which have a rate of change in fluorescence quantum yield from before heating to after heating of 10% or less when heated in the atmosphere at 180° C. for 5 hours.

13. The wavelength conversion layer according to claim 1, wherein
a content of Cd in the semiconductor nanoparticles is 100 ppm or less.

14. A wavelength conversion layer containing semiconductor nanoparticles, wherein
each of the semiconductor nanoparticles contained in the wavelength conversion layer has a core and a shell having one or more layers;
the wavelength conversion layer can convert light having a wavelength of 450 nm to light having a peak wavelength of 500 nm to 550 nm, or light having a peak wavelength of 600 nm to 660 nm;
the core contains In and P;
at least one layer of the shell is ZnXTe (wherein X represents Se or S, or both Se and S); and
amounts of X and Te contained in the shell satisfy Te/(X+Te)=0.01 to 0.60 (wherein X is Se).

15. The wavelength conversion layer according to claim 14, wherein
a content of the semiconductor nanoparticles in the wavelength conversion layer is 20 mass % to 60 mass %.

16. The wavelength conversion layer according to claim 14, wherein
the shell of the semiconductor nanoparticles has two or more layers, and the outermost layer is ZnS.

17. The wavelength conversion layer according to claim 14, wherein a content of Cd in the semiconductor nanoparticles is 100 ppm or less.

18. A wavelength conversion layer containing semiconductor nanoparticles, wherein
each of the semiconductor nanoparticles contained in the wavelength conversion layer has a core and a shell having one or more layers;
the wavelength conversion layer can convert light having a wavelength of 450 nm to light having a peak wavelength of 500 nm to 550 nm, or light having a peak wavelength of 600 nm to 660 nm;
the core contains In and P;
at least one layer of the shell is ZnXTe (wherein X represents Se or S, or both Se and S); and
amounts of X and Te contained in the shell satisfy Te/(X+Te)=0.01 to 0.60, wherein X is S.

19. The wavelength conversion layer according to claim 18, wherein
a content of the semiconductor nanoparticles in the wavelength conversion layer is 20 mass % to 60 mass %.

20. The wavelength conversion layer according to claim 18, wherein
the shell of the semiconductor nanoparticles has two or more layers, and the outermost layer is ZnS.

* * * * *